United States Patent
Oh et al.

(10) Patent No.: US 8,804,410 B2
(45) Date of Patent: Aug. 12, 2014

(54) STACKED MRAM DEVICE AND MEMORY SYSTEM HAVING THE SAME

(75) Inventors: Hyung-Rok Oh, Yongin-si (KR); Se-Chung Oh, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 54 days.

(21) Appl. No.: 13/586,976

(22) Filed: Aug. 16, 2012

(65) Prior Publication Data

US 2013/0044538 A1    Feb. 21, 2013

(30) Foreign Application Priority Data

Aug. 16, 2011 (KR) .................. 10-2011-0081224

(51) Int. Cl.
*G11C 11/00* (2006.01)
*G11C 11/16* (2006.01)
*H01L 27/22* (2006.01)

(52) U.S. Cl.
CPC .............. *G11C 11/16* (2013.01); *H01L 27/228* (2013.01)
USPC ........................................ 365/158; 365/171

(58) Field of Classification Search
CPC ............................ G11C 11/16; H01L 27/228
USPC .................................. 365/148, 158, 171, 173
See application file for complete search history.

(56) References Cited

U.S. PATENT DOCUMENTS

| | | | |
|---|---|---|---|
| 6,911,710 B2 | 6/2005 | Nickel et al. | |
| 6,992,359 B2 | 1/2006 | Nguyen et al. | |
| 7,045,841 B2 | 5/2006 | Hong et al. | |
| 7,061,036 B2 * | 6/2006 | Kajiyama | 257/295 |
| 7,764,538 B2 | 7/2010 | Jung et al. | |
| 7,777,261 B2 | 8/2010 | Huai et al. | |
| 7,948,044 B2 | 5/2011 | Horng et al. | |
| 8,230,375 B2 * | 7/2012 | Madurawe | 716/117 |
| 8,429,585 B2 * | 4/2013 | Madurawe | 716/121 |

FOREIGN PATENT DOCUMENTS

| | | |
|---|---|---|
| JP | 2005-303302 | 10/2005 |
| JP | 2007-525847 A | 9/2007 |
| JP | 2009-509357 A | 3/2009 |
| JP | 2009-158665 | 7/2009 |
| JP | 2009-253303 | 10/2009 |
| KR | 1020060046651 A | 5/2006 |
| KR | 1020060125913 A | 12/2006 |
| KR | 1020080070812 A | 7/2008 |

OTHER PUBLICATIONS

S.C. Oh, J.H. Jeong, W.C. Lim, W.J. Kim, Y.H. Kim, H.J. Shin, J.E. Lee, Y.G. Shin, S.Choi, C. Chung On-axis scheme Novel MTJ structure for sub-30nm Gb density STT-MRAM, IEDM, 2010 IEEE International, Dec. 6-8, 2010, p. 12.6.1-12.6.4, Sanfrancisco, CA.

* cited by examiner

*Primary Examiner* — Gene Auduong
(74) *Attorney, Agent, or Firm* — Muir Patent Consulting, PLLC

(57) ABSTRACT

Provided is a stacked magnetic random access memory (MRAM) in which memory cell arrays having various characteristics or functions are included in memory cell layers. The stacked MRAM device includes a semiconductor substrate and at least one memory cell layers. The semiconductor substrate includes a first memory cell array. Each of the memory cell layers includes a memory cell array having a different function from the first memory cell array and is stacked on the first memory cell array. As a result, the stacked MRAM device has high density, high performance, and high reliability.

18 Claims, 12 Drawing Sheets

FIG. 7

| Mag.Direction | Process Parameter | | | | Performance | | Reliability | | No of Layer | Application |
|---|---|---|---|---|---|---|---|---|---|---|
| | SIZE | AR | tOX | tFL | Speed | Power | Endurance | Retention | | |
| In-Planar | 40 | 3 | med | med | med | med | med | med | 0 | Normal cell |
| | 40 | 3 | med | thin | med | low | high | med | 1 | Ecc/Ref. cell |
| | 40 | 3 | med | thick | med | med | med | high | 2 | OTP cell |
| In-Perpendicular | 20 | 1 | med | med | med | med | med | med | 0 | Normal cell |
| | 20 | 1 | med | thick | med | low | high | low | 1 | Ecc/Ref. cell |
| | 20 | 1 | med | thin | med | high | med | high | 2 | OTP cell |

STACKED MRAM DEVICE AND MEMORY SYSTEM HAVING THE SAME

CROSS-REFERENCE TO RELATED APPLICATION

This application claims priority under 35 U.S.C. §119 to Korean Patent Application No. 10-2011-0081224 filed on Aug. 16, 2011, the disclosure of which is hereby incorporated by reference in its entirety.

BACKGROUND

1. Field

Example embodiments relate to a memory device and, more particularly, a stacked magnetic random access memory (MRAM) device including magnetic tunnel junction (MTJ) memory cells.

2. Description of Related Art

There is a growing interest in magnetic random access memories (MRAMs) as low-power non-volatile data memory devices. An MRAM device may store data in a non-volatile manner using a plurality of magnetic tunnel junction (MTJ) memory cells formed in a semiconductor integrated circuit (IC), and enable random access to each of the MTJ memory cells.

In recent years, research has been conducted into a technique of reducing a chip size of a memory device by 3-dimensionally stacking memory cell layers.

SUMMARY

Example embodiments provide a stacked magnetic random access memory (MRAM) device having high density, high performance, and high reliability by disposing memory cell arrays having various characteristics in memory cell layers.

Other embodiments provide a memory system including the stacked MRAM device.

According to some example embodiments, there is provided a stacked magnetic random access memory (MRAM) device. The stacked MRAM device includes a semiconductor substrate and first memory cell array and one or more additional memory cells arrays. The first memory cell array includes a plurality of memory cells and is disposed on the semiconductor substrate. The one or more memory cell arrays include at least a second memory cells array, the second memory cell array includes a plurality of memory cells. The second memory cell array has different function from the first memory cell array, and the second memory cell array is stacked on the first memory cell array.

According to example embodiments, there is provided a magnetic random access memory (MRAM) device. The MRAM device includes a substrate, a first memory cell array, and a second memory cell array. The substrate includes a control circuit. The first memory cell array is disposed on the substrate and includes a plurality of memory cells. Each of the plurality of memory cells of the first memory cell array includes a first magnetic element and a first access element electrically connected to the first magnetic element. The first magnetic element includes a first pinned magnetic layer, a first free magnetic layer having a first thickness, and a first tunnel barrier layer between the first pinned magnetic layer and the first free magnetic layer. The second memory cell array is stacked on the first memory cell array and the second memory cell array includes a plurality of memory cells. Each of the plurality of memory cells of the second memory cell array includes a second magnetic element and a second access element electrically connected to the second magnetic element. The second magnetic element includes a second pinned magnetic layer, a second free magnetic layer having a second thickness different from the first thickness, and a second tunnel barrier layer between the second pinned magnetic layer and the second free magnetic layer. The control circuit is configured to drive the first and second memory cell arrays.

According to example embodiments, there is provided a magnetic random access memory (MRAM) device. The MRAM device includes a substrate, a first magnetic element array, and a second magnetic element array. The first magnetic element array is disposed on the substrate and the first magnetic element array includes a plurality of magnetic elements. Each of the plurality of magnetic elements of the first magnetic element array includes a first pinned magnetic layer, a first tunnel barrier layer, and a first free magnetic layer having a first thickness. The second magnetic element array is stacked on the first magnetic element array and the second magnetic element array includes a plurality of magnetic elements. Each of the plurality of magnetic elements of the second magnetic element array includes a second pinned magnetic layer, a second tunnel barrier layer, and a second free magnetic layer having a second thickness different from the first thickness.

BRIEF DESCRIPTION OF THE DRAWINGS

Example embodiments will be more clearly understood from the following detailed description taken in conjunction with the accompanying drawings. FIGS. 1 to 15 represent non-limiting, example embodiments as described herein.

FIG. 1 is a block diagram of a memory system including a stacked magnetic random access memory (MRAM) according to example embodiments;

FIG. 2 is a perspective view of a 3-dimensional structure of the stacked MRAM device shown in FIG. 1 according to one embodiment;

FIG. 3 is a front view of memory cells that may be included in respective layers of the stacked MRAM device shown in FIG. 2 according to one embodiment;

FIG. 4 is a circuit diagram of a memory cell array included in the stacked MRAM device shown in FIG. 2 according to one embodiment;

FIG. 5 is a circuit diagram of an example of an MRAM cell including a tunneling magneto-resistive (TMR) element;

FIG. 6 is a graph showing the correlation between the thickness of a free magnetic layer and magnetic energy;

FIG. 7 is a table showing process parameters, the characteristics of memory cells, and circuits appropriate for the cells;

FIG. 8 is a circuit diagram of a memory cell array included in the stacked MRAM device shown in FIG. 2 according to another embodiment;

FIG. 9 is a perspective view of the 3-dimensional structure of the stacked MRAM device shown in FIG. 1 according to another embodiment;

FIG. 10 is a cross-sectional view taken along line I-I' of FIG. 9 when the stacked MRAM device shown in FIG. 9 includes two additional memory cell array layers stacked on a semiconductor substrate;

FIG. 11 is a block diagram of a circuit configuration of a stacked MRAM device according to example embodiments;

FIG. 12 is a block diagram of a circuit configuration of a stacked MRAM device according to other example embodiments;

FIG. 13 is a block diagram of a circuit diagram of a stacked MRAM device according to other example embodiments;

FIG. 14 is a perspective view of the 3-dimensional structure of the stacked MRAM device shown in FIG. 1 according to another embodiment; and FIG. 15 is a block diagram of an electronic system including a stacked MRAM device according to example embodiments.

DETAILED DESCRIPTION OF THE EMBODIMENTS

Figure 1:
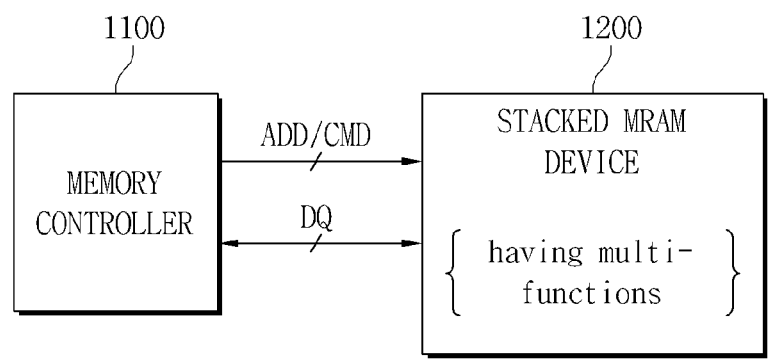

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity.

It will be understood that, although the terms first, second, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

It will be understood that when an element or layer is referred to as being "on", "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the present disclosure may be performed otherwise. That is, the respective steps may be performed in a specified order, substantially at the same time, or in reverse order.

Hereinafter, example embodiments will be described in detail with reference to the accompanying drawings.

FIG. 1 is a block diagram of a memory system including a stacked magnetic random access memory (MRAM) device according to example embodiments.

Referring to FIG. 1, the memory system may include a memory controller 1100 and a stacked MRAM device 1200.

The memory controller 1100 may generate an address ADD and a command CMD, and transmit data DQ to the stacked MRAM device 1200 or receive data DQ from the stacked MRAM device 1200. The stacked MRAM device 1200 may operate based on the address ADD and the command CMD, and include a semiconductor substrate and at least one memory cell layers. The stacked MRAM device 1200 may be part of a semiconductor chip, a package including a semiconductor chip, a package-on-package device, a semiconductor memory module, etc.

The semiconductor substrate may include a first memory cell array in a 0-th memory cell layer. Each of the additional memory cell layers may include a memory cell array having a different function from the first memory cell array and may be stacked on the first memory cell array.

Figure 2:
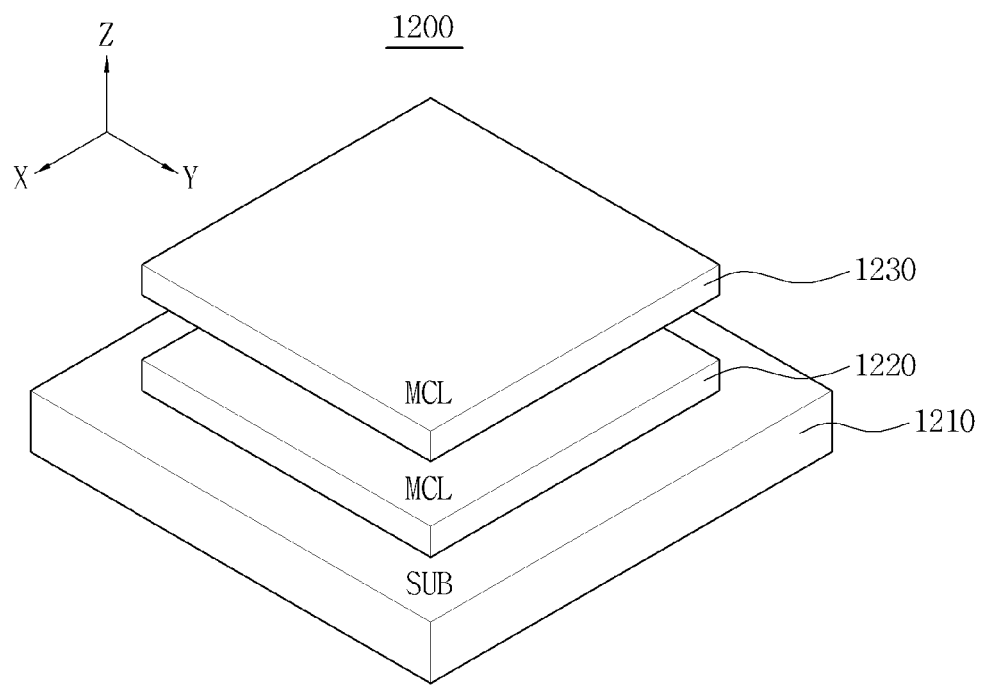

FIG. 2 is a perspective view of a 3-dimensional structure of the stacked MRAM device 1200 shown in FIG. 1 according to one embodiment.

Referring to FIG. 2, the stacked MRAM device 1200 may include a semiconductor substrate 1210 in the 0-th memory cell layer, a first memory cell layer 1220, and a second memory cell layer 1230.

The semiconductor substrate 1210 may include a first memory cell array. The first memory cell layer 1220 may be stacked on the first memory cell array of the semiconductor substrate 1210 and include a second memory cell array having a different function from the first memory cell array. The second memory cell layer 1230 may be stacked on the first memory cell layer 1220 and include a third memory cell array having a different function from the first and/or the second memory cell array. The stacked layers or arrays can be part of a 3-dimensional array structure, or could be individual arrays of separately stacked chips.

Figure 3:
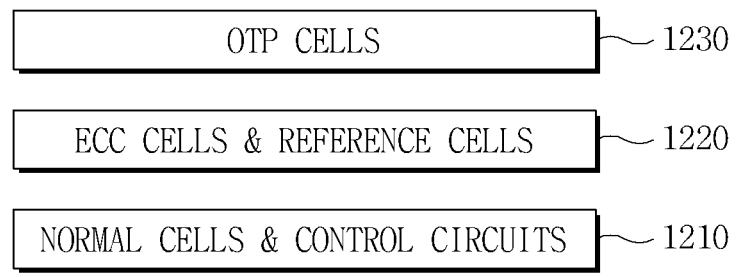

FIG. 3 is a front view of cells that may be included in respective layers of the stacked MRAM device 1200 shown in FIG. 2 according to one embodiment.

Referring to FIG. 3, the semiconductor substrate may include normal data cells and a control circuit configured to drive memory cell arrays. For example, normal data may store data indicated for storage by the memory controller 1100. The first memory cell layer 1220 may include error-correction code (ECC) cells in which ECC data is stored, or reference cells in which reference resistances are stored. The second memory cell layer 1230 may include one-time programming (OTP) cells in which data is programmed only one time. Each of these layers may be configured and/or designated for their respective functions during manufacturing or later, and may be designated by the memory controller 1100 or another device.

Figure 4:
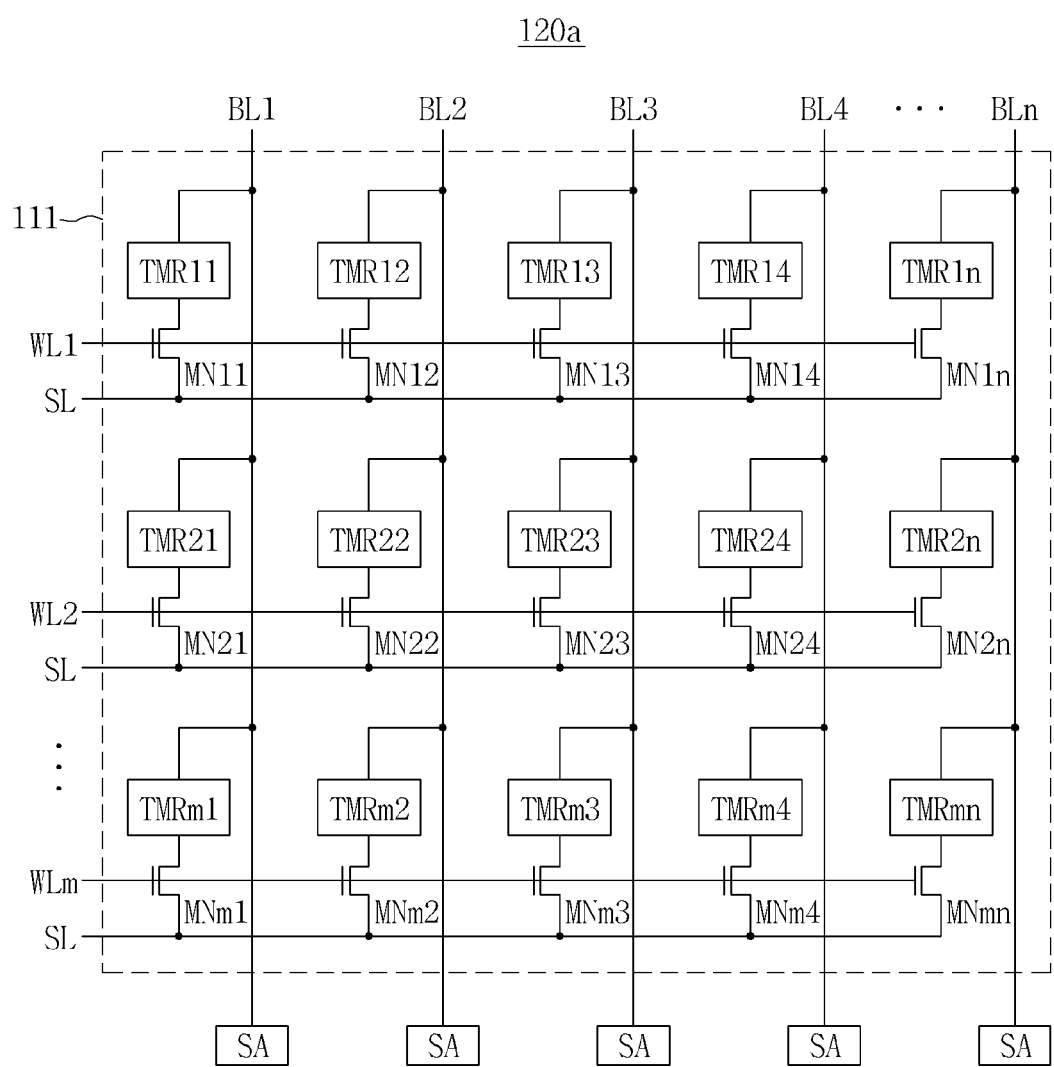

FIG. 4 is a circuit diagram of a memory cell array included in the stacked MRAM device 1200 shown in FIG. 2 according to one embodiment.

Referring to FIG. 4, a memory cell layer 120*a* may include a memory cell array 111 and sense amplifiers SA connected to bit lines BL1 to BLn. The memory cell array 111 may be disposed on the substrate 1210, in the first memory cell layer 1220, and/or in the second memory cell layer 1230.

The memory cell array 111 may include a plurality of tunneling magneto-resistive (TMR) elements TMR11 to TMR1n, TMR21 to TMR2n, . . . , and TMRm1 to TMRmn, and access transistors MN11 to MN1n, MN21 to MN2n, . . . , and MNm1 to MNmn connected in series to the TMR elements TMR11 to TMR1n, TMR21 to TMR2n, . . . , and TMRm1 to TMRmn. Each of the transistors MN11 to MN1n, MN21 to MN2n, . . . , and MNm1 to MNmn may be, for example, a planar-type transistor or a vertical-type transistor. The memory cell array 111 may output a variation in current caused by a variation in the resistance of a TMR element of a selected memory cell out of the TMR elements TMR11 to TMR1n, TMR21 to TMR2n, . . . , and TMRm1 to TMRmn to the corresponding bit line. The sense amplifiers SA may sense and amplify voltage signals of the corresponding bit lines.

Each of the TMR elements TMR11 to TMR1n, TMR21 to TMR2n, . . . , and TMRm1 to TMRmn may have a first terminal connected to the corresponding one of a plurality of bit lines BL1 to BLn, and each of the access transistors MN11 to MN1n, MN21 to MN2n, . . . , and MNm1 to MNmn may have a drain connected to a second terminal of the corresponding one of the TMR elements TMR11 to TMR1n, TMR21 to TMR2n, . . . , and TMRm1 to TMRmn, a gate connected to the corresponding one of a plurality of word lines WL1 to WLm, and a source connected to a source line SL.

In one embodiment, each of the access transistors MN11 to MN1n, MN21 to MN2n, . . . , and MNm1 to MNmn connected to the corresponding one of the TMR elements TMR11 to TMR1n, TMR21 to TMR2n, . . . , and TMRm1 to TMRmn may be disposed on a different layer from the layer on which the TMR elements are disposed (e.g., transistors could be at the semiconductor substrate, and TMR can be at a different layer).

Figure 5:
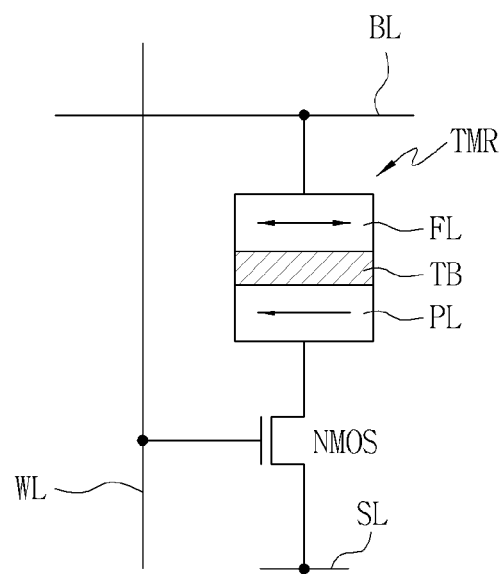

FIG. 5 is a circuit diagram of an example of an MRAM cell including a TMR element according to example embodiments.

Referring to FIG. 5, a memory cell (i.e., the MRAM cell) may include a TMR element and an access transistor NMOS. The TMR element may have a first terminal connected to a bit line BL, and the access transistor NMOS may have a drain connected to a second terminal of the TMR element, a gate connected to a word line WL, and a source connected to a source line SL.

The TMR element may include a pinned magnetic layer PL having a predetermined pinned magnetization direction, a free magnetic layer FL configured so it is able to be magnetized in the direction of an externally applied magnetic field, and a tunnel barrier layer TB formed of an insulating film between the pinned magnetic layer PL and the free magnetic layer FL.

Figure 6:
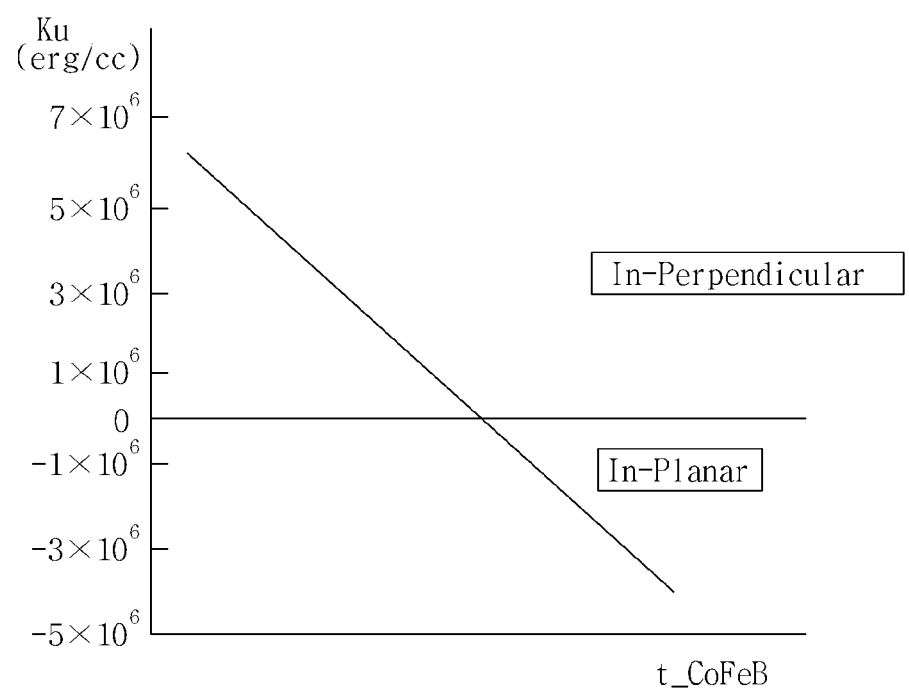

FIG. 6 is a graph showing the correlation between the thickness of a free magnetic layer and magnetic energy. In FIG. 6, an abscissa denotes the thickness tFL of a free magnetic layer formed of a cobalt-iron-boron (CoFeB) alloy, which is a ferromagnetic material, and an ordinate denotes magnetic energy Ku.

Referring to FIG. 6, in the case of perpendicular magnetization, as the thickness tFL of the free magnetic layer decreases, an absolute value of magnetic energy Ku increases. Accordingly, in the case of perpendicular magnetization, as the thickness tFL of the free magnetic layer decreases, a data retention of an MRAM cell may increase and a data endurance of the MRAM cell may decrease, and as the thickness tFL of the free magnetic layer increases, the data retention of the MRAM cell may decrease and the data endurance of the MRAM cell may increase. In the case of planar magnetization, as the thickness tFL of the free magnetic layer decreases, an absolute value of magnetic energy Ku decreases. Accordingly, in the case of planar magnetization, as the thickness tFL of the free magnetic layer decreases, the data retention of the MRAM cell may decrease and the data endurance of the MRAM cell may increase, and as the thickness tFL of the free magnetic layer increases, the data retention of the MRAM cell may increase and the data endurance of the MRAM cell may decrease.

FIG. 7 is a table showing process parameters, the characteristics of memory cells, and circuits appropriate for the memory cells. In FIG. 7, "SIZE" denotes the size of a TMR element, aspect ratio AR denotes the ratio of a width of one terminal of a TMR element to a length thereof, "tOX" denotes the thickness of a tunnel barrier layer TB (i.e., an oxide layer) of the TMR element, and "tFL" denotes the thickness of a free magnetic layer of the TMR element. Also, "med" denotes medium, "Speed" denotes operation speed, and "Power" denotes an applied power supply voltage.

In FIG. 7, in the case of planar magnetization where a magnetic material is magnetized in a horizontal direction, conditions where SIZE=40, AR=3, and tOX=med were applied. In the case of perpendicular magnetization where a magnetic material is magnetized in a perpendicular direction, conditions where SIZE=20, AR=1, and tOX=med were applied.

Referring to FIG. 7, in the case of planar magnetization, when the thickness tFL of the free magnetic layer of the TMR element disposed in the substrate of the 0-th memory cell layer is a first thickness, a thickness tFL of the free magnetic layer of the TMR element disposed in the first memory cell layer may be smaller than the first thickness, and a thickness tFL of the free magnetic layer of the TMR element disposed in the second memory cell layer may be greater than the first thickness. As a result, normal cells may have medium endurance characteristics and medium retention characteristics, and be disposed in the 0-th memory cell layer. ECC cells in which ECC data are stored or reference cells in which reference resistances are stored may have higher endurance characteristics than the normal cells, and be disposed in a first memory cell layer. OTP cells may have higher retention characteristics than the normal cells, and be disposed in a second memory cell layer.

In the case of perpendicular magnetization, when the thickness tFL of a free magnetic layer of a TMR element included in the 0-th memory cell layer is a first thickness, a thickness tFL of a free magnetic layer of a TMR element disposed in a first memory cell layer may be greater than the first thickness, and a thickness tFL of a free magnetic layer of a TMR element disposed in a second memory cell layer may be smaller than the first thickness. As a result, normal cells may have medium endurance characteristics and medium retention characteristics, and be disposed in a 0-th memory cell layer. ECC cells in which ECC data are stored or reference cells in which reference resistances are stored may have higher endurance characteristics than the normal cells, and be disposed in the first memory cell layer. OTP cells may have higher retention characteristics than the normal cells, and be disposed in the second memory cell layer.

In the table shown in FIG. 7, the 0-th memory cell layer may correspond to the semiconductor substrate 1210 of FIG. 2, the first memory cell layer may correspond to the first memory cell layer 1220, and the second memory cell layer may correspond to the second memory cell layer 1230 of FIG. 2.

Figure 8:
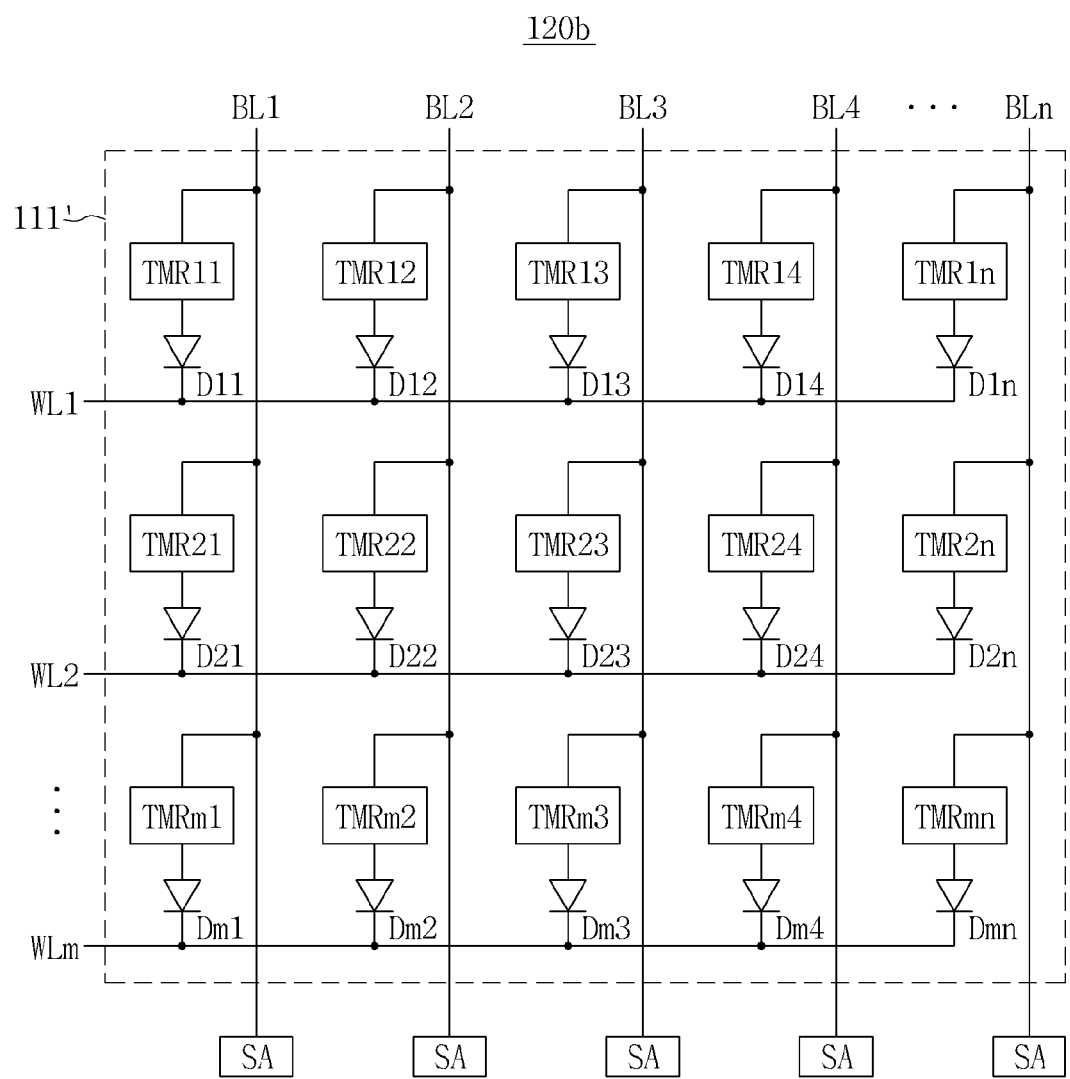

FIG. 8 is a circuit diagram of a memory cell array included in the stacked MRAM device shown in FIG. 2 according to another embodiment.

Referring to FIG. 8, a memory cell layer 120b may include a memory cell array 111' and sense amplifiers SA connected to bit lines BL1 to BLn. The memory cell array 111' may be disposed on the substrate 1210, in the first memory cell layer 1220, and/or in the second memory cell layer 1230.

The memory cell array 111' may include a plurality of TMR elements TMR11 to TMR1n, TMR21 to TMR2n, . . . , and TMRm1 to TMRmn, and diodes D11 to D1n, D21 to D2n, . . . , and Dm1 to Dmn as access elements connected in series to the TMR elements TMR11 to TMR1n, TMR21 to TMR2n, . . . , and TMRm1 to TMRmn, respectively. The memory cell array 111' may output a variation in current caused by a variation in the resistance of a TMR element of a selected memory cell out of the TMR elements TMR11 to TMR1n, TMR21 to TMR2n, . . . , and TMRm1 to TMRmn. The sense amplifiers SA may sense and amplify voltage signals of the corresponding bit lines.

Each of the TMR elements TMR11 to TMR1n, TMR21 to TMR2n, . . . , and TMRm1 to TMRmn may have a first terminal connected to the corresponding one of a plurality of bit lines BL1 to BLn, and each of the diodes D11 to D1n, D21 to D2n, . . . , and Dm1 to Dmn may have an anode connected to a second terminal of the corresponding one of the TMR elements TMR11 to TMR1n, TMR21 to TMR2n, . . . , and TMRm1 to TMRmn and a cathode connected to the corresponding one of a plurality of word lines WL1 to WLm.

Figure 9:
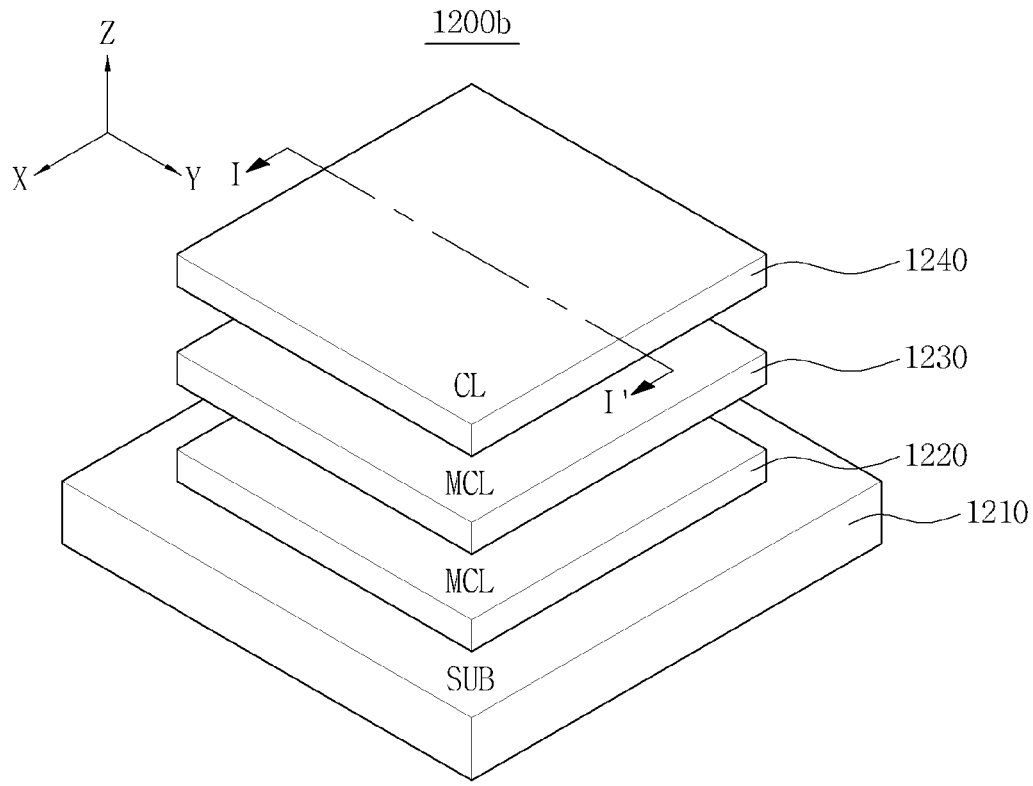

FIG. 9 is a perspective view of the 3-dimensional structure of the stacked MRAM device shown in FIG. 1 according to another embodiment.

Referring to FIG. 9, a stacked MRAM device 1200b may include a semiconductor substrate 1210, a first memory cell layer 1220, a second memory cell layer 1230, and a connection layer 1240.

The semiconductor substrate 1210 may include a first memory cell array. The first memory cell layer 1220 may be stacked on the semiconductor substrate 1210 and the first memory cell array, and include a second memory cell array having a different function from the first memory cell array. The second memory cell layer 1230 may be stacked on the first memory cell layer 1220 and include a third memory cell array having a different function from the first and/or the second memory cell array. The connection layer 1240 will be explained in FIG. 10, hereinafter.

Figure 10:
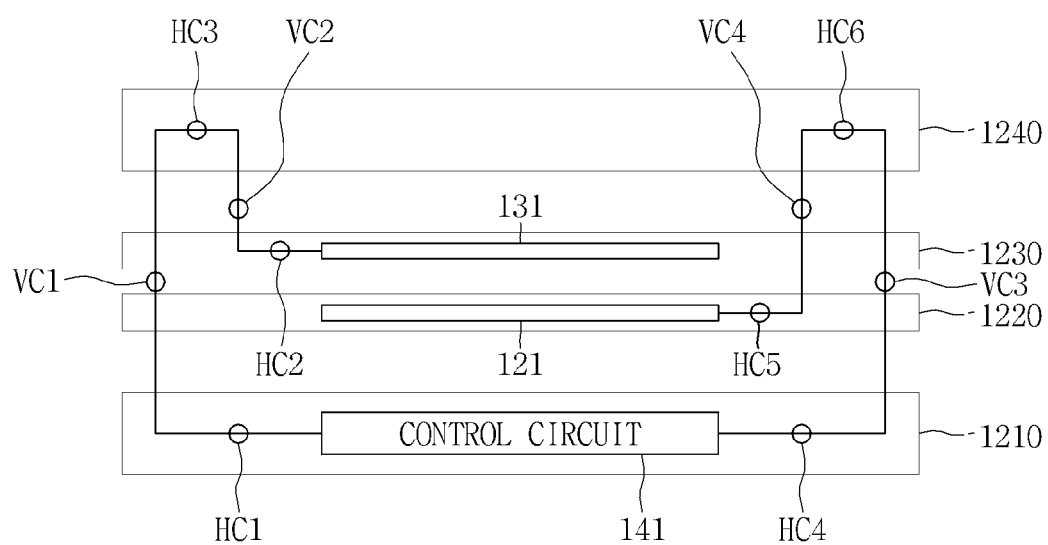

FIG. 10 is a cross-sectional view taken along line I-I' of FIG. 9 when the stacked MRAM device shown in FIG. 9 includes two additional memory cell layers.

Referring to FIG. 10, a stacked MRAM device 1200c may include a semiconductor substrate 1210, memory cell layers 1220 and 1230, and a connection layer 1240.

The semiconductor substrate 1210 may include a control circuit 141, the memory cell layer 1220 may include a cell array 121, and the memory cell layer 1230 may include a cell array 131. The memory cell layers 1220 and 1230 may be stacked on the semiconductor substrate 1210, and the memory cell layer 1230 may be stacked on the memory cell layer 1220. Although not shown, the semiconductor substrate 1210 may include a memory cell layer having a cell array in addition to the control circuit 141.

The connection layer 1240 may be disposed above the semiconductor substrate 1210 separate from the memory cell layers 1220 and 1230, and may electrically connect memory cell selection lines arranged in the memory cell layers 1220 and 1230 with the control circuit 141 included in the semiconductor substrate 1210.

The stacked MRAM device 1200c may electrically connect the memory cell selection lines arranged in the memory cell layers 1220 and 1230 with a control circuit 141 formed in the semiconductor substrate 1210 through horizontal connection lines and vertical connection lines. For example, memory cell selection lines related to the cell array 131 may be electrically connected to the control circuit 111 formed in the semiconductor substrate 1210 through a horizontal connection line HC1, a vertical connection line VC1, a horizontal connection line HC2, a vertical connection line VC2, and a horizontal connection line HC3. Memory cell selection lines related to the cell array 121 may be electrically connected to the control circuit 111 through a horizontal connection line HC4, a vertical connection line VC3, a horizontal connection line HC5, a vertical connection line VC4, and a horizontal connection line HC6.

The horizontal connection line HC1 and the horizontal connection line HC4 may be formed within the semiconductor substrate 1210, the horizontal connection line HC2 may be formed within a memory cell layer 1230, and the horizontal connection line HC5 may be formed within the memory cell layer 1220. The horizontal connection line HC3 and the horizontal connection line HC6 may be formed within the connection layer 1240.

The stacked MRAM device 1200c shown in FIG. 10 may include the connection layer 1240 separate from memory cell layers to allow electrical connection between memory cell selection lines arranged in memory cell layers and the control circuit 141 formed in the semiconductor substrate 1210. Accordingly, even if a decoding scheme is changed, the stack structure of the stacked MRAM device 1200c shown in FIG. 10 may not be affected. For example, connection between the control circuit 141 and word lines, or connection between the control circuit 141 and bit lines may vary depending on whether a memory cell layer has a double or four-layered structure. In this case, the stacked MRAM device 1200c of FIG. 10 may allow or preclude connection between the third horizontal connection line HC3 and the sixth horizontal connection line HC6 depend on the stack structure of the stacked MRAM device 1200c.

Therefore, the stacked MRAM device 1200c shown in FIG. 10 may have high flexibility when memory cell selection lines formed in memory cell layers stacked on the semiconductor substrate 1210 are electrically connected to the control circuit 141 formed in the semiconductor substrate (1210).

Figure 11:
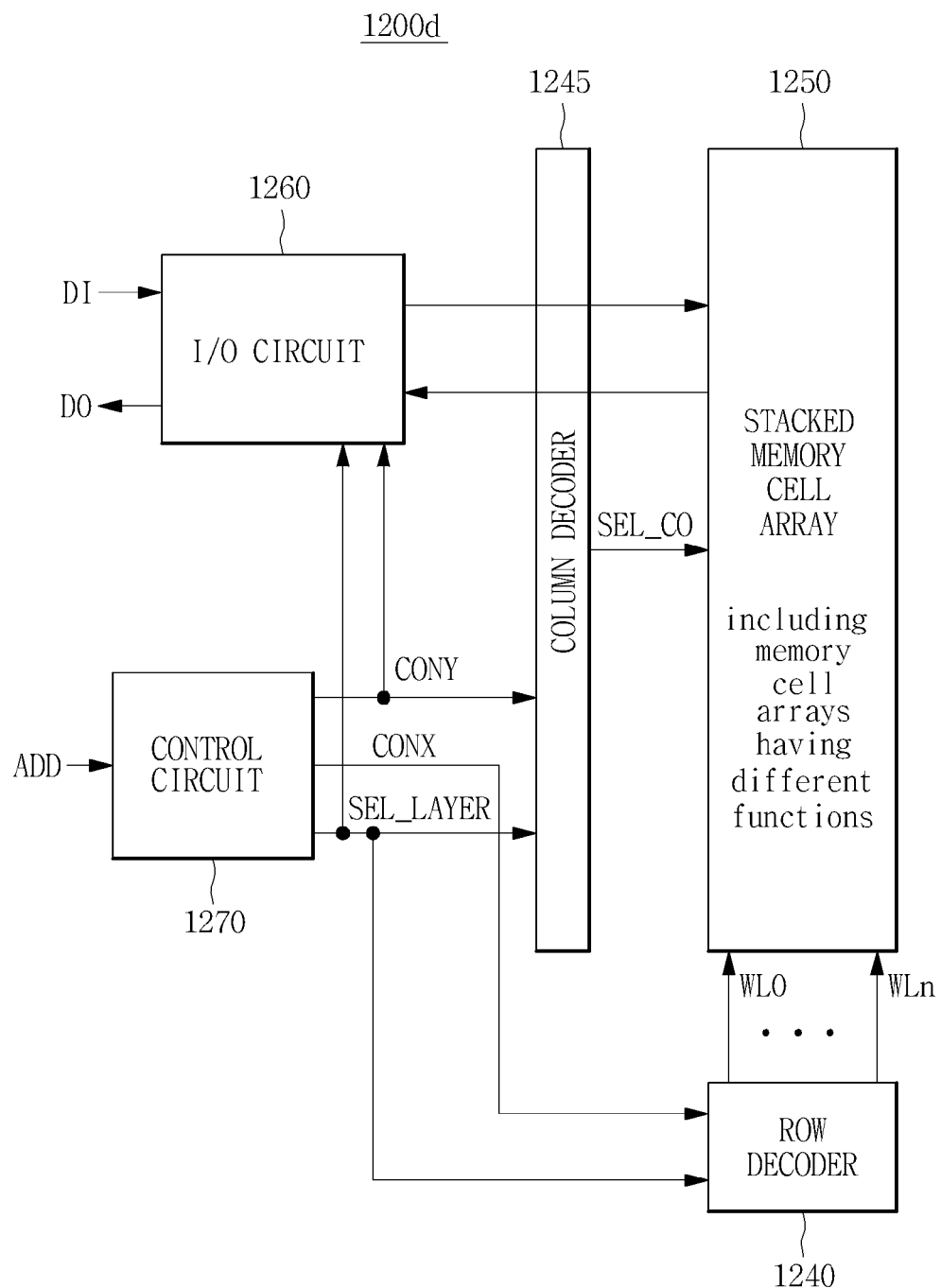

FIG. 11 is a block diagram of a circuit configuration of a stacked MRAM device according to example embodiments.

Referring to FIG. 11, a stacked MRAM device 1200d may include an input/output (I/O) circuit 1260, a control circuit 1270, a row decoder 1240, a column decoder 1245, and a stacked memory cell array 1250.

The stacked memory cell array 1250 may include at least two memory cell arrays. Each of the memory cell arrays may be disposed in each of memory cell layers, respectively, and each of the memory cell arrays may include a plurality of memory cells.

The control circuit 1270 may set a program mode of memory cell layers based on an address signal ADD and program information, generate a row control signal CONX and a column control signal CONY by controlling a time point and voltage level of the address signal ADD, and generate a layer selection signal SEL_LAYER based on the row control signal CONX and the column control signal CONY.

The row decoder 1240 may generate word line driving signals WL0 to WLn by decoding the row control signal CONX and the layer selection signal SEL_LAYER, and transmit the word line driving signals WL0 to WLn to the stacked memory cell array 1250. The column decoder 1245 may generate a column selection signal SEL_CO by decoding the column control signal CONY and the layer selection signal SEL_LAYER, and transmit the column selection signal SEL_CO to the stacked memory cell array 1250. The I/O circuit 1260 may include a sense amplifier and a write driver circuit, and transmit input data DI to the stacked memory cell array 1250 in response to the column control signal CONY and the layer selection signal SEL_LAYER in a write operation mode. Also, the I/O circuit 1260 may sense and amplify a voltage of a bit line, and generate output data DO in response to the column control signal CONY and the layer selection signal SEL_LAYER in a read operation mode.

The stacked MRAM device 1200*d* shown in FIG. 11 may include a semiconductor substrate and at least one memory cell layer. The semiconductor substrate may include a first memory cell array. Each of the memory cell layers may include a memory cell array having a different function from the first memory cell array and be stacked on the semiconductor substrate and the first memory cell array.

In FIG. 11, the stacked MRAM device 1200*d* may be formed within the semiconductor substrate and the memory cell layers, and the semiconductor substrate may include the control circuit 1270 configured to drive memory cell arrays of the memory cell layers.

Figure 12:
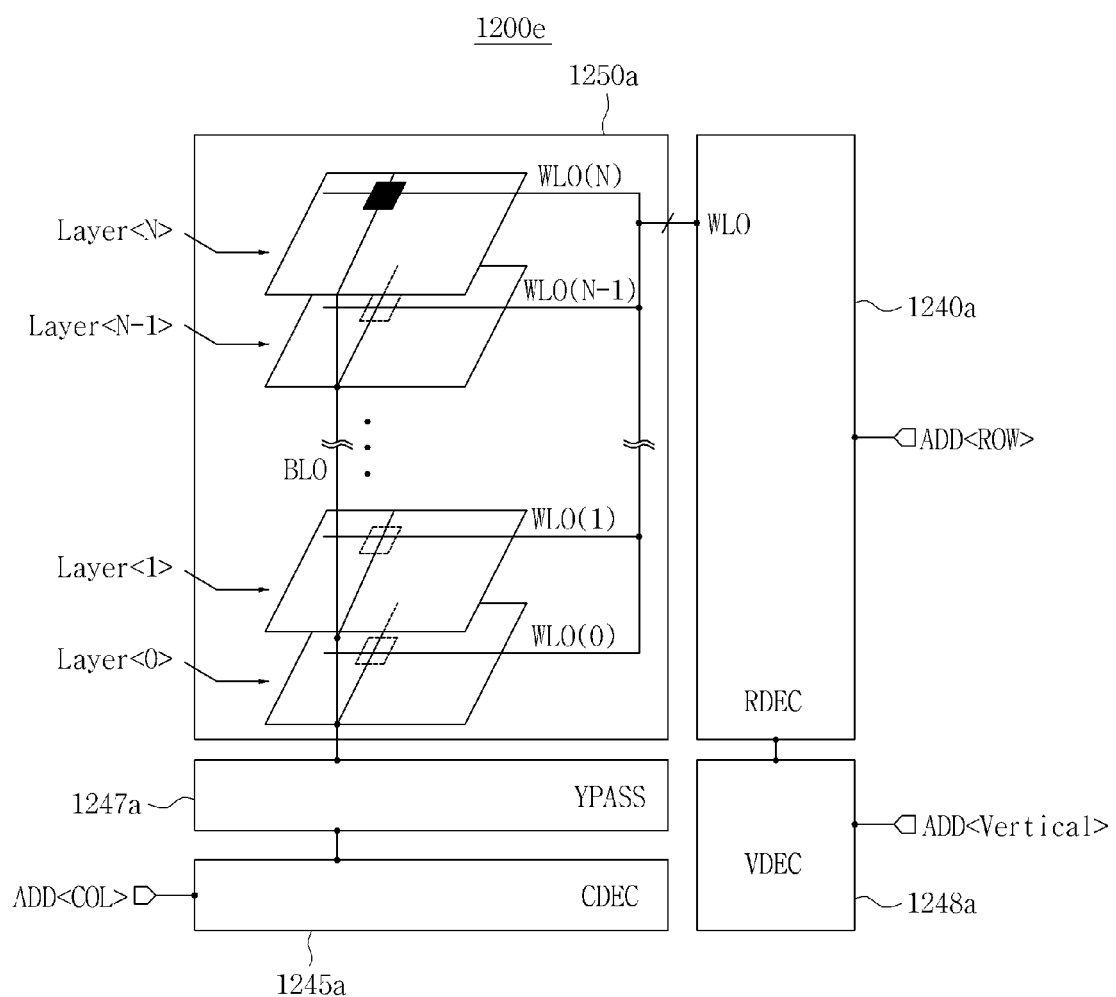

FIG. 12 is a block diagram of a circuit configuration of a stacked MRAM device according to other example embodiments.

Referring to FIG. 12, a stacked MRAM device 1200*e* may include a stacked memory cell array 1250*a*, a row decoder 1240*a*, a column decoder 1245*a*, and a column selection circuit 1247*a*. Also, the stacked MRAM device 1200*e* shown in FIG. 12 may further include a vertical decoder 1248*a* configured to decode a vertical address signal ADD<vertical>, and transmit a decoded signal to the row decoder 1240*a*.

The stacked memory cell array 1250*a* may be disposed in memory cell layers Layer<0>~Layer<N> and be controlled by the row decoder 1240*a* and the column selection circuit 1247*a*. The row decoder 1240*a* may decode a row address signal ADD<ROW>, and generate word line driving signals WL0(0) to WL0(N). The column decoder 1245*a* may decode a column address signal ADD<COL>, and generate a column selection signal. The column selection circuit 1247*a* may amplify a column selection signal, and control I/O operations of data to and from a selected memory cell arrays.

In an example shown in FIG. 12, a layer decoding operation for selecting a memory cell layer may be performed by the row decoder 1240*a* (i.e., an X-decoder).

Figure 13:
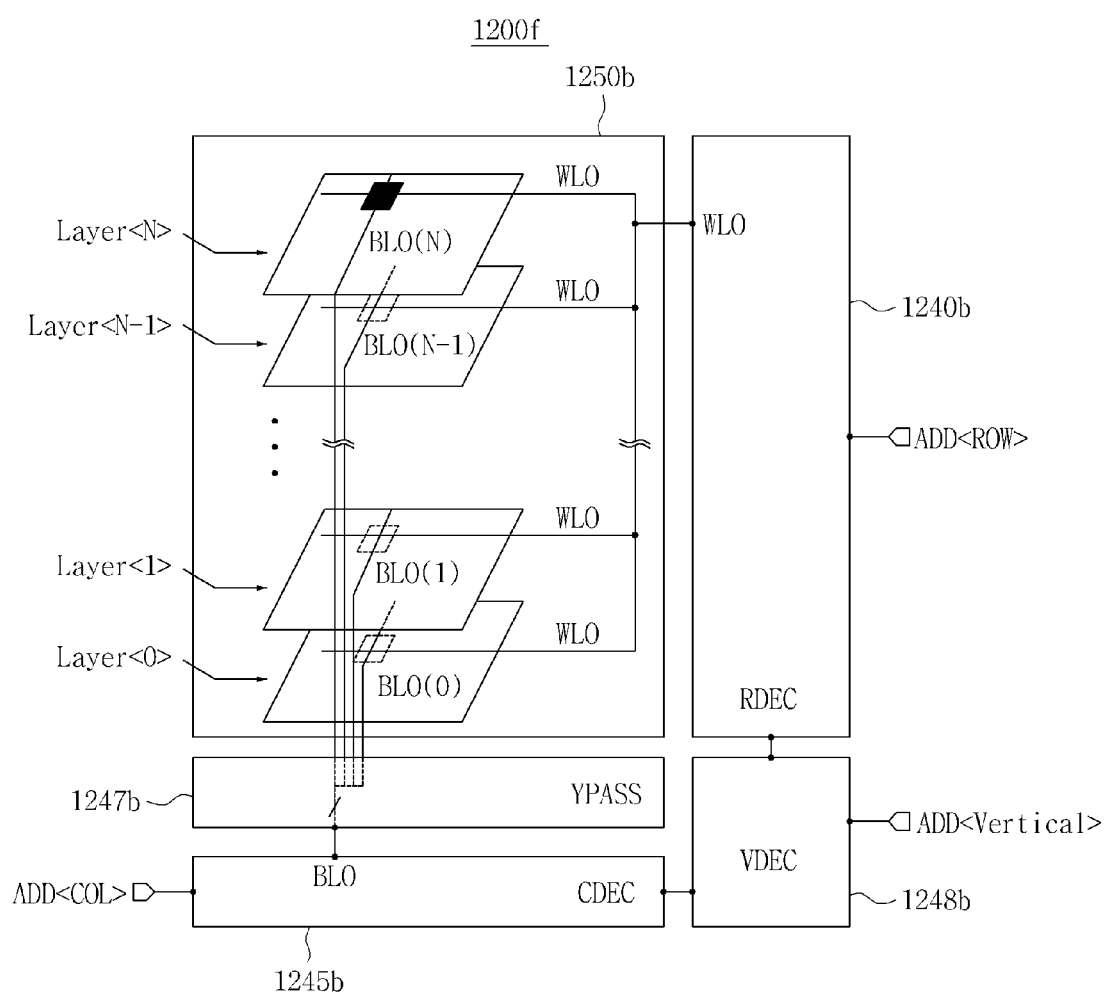

FIG. 13 is a block diagram of a circuit configuration of a stacked MRAM device according to other example embodiments.

Referring to FIG. 13, a stacked MRAM device 1200*f* may include a stacked memory cell array 1250*b*, a row decoder 1240*b*, a column decoder 1245*b*, and a column selection circuit 1247*b*. The stacked MRAM device 1200*f* shown in FIG. 12 may further include a vertical decoder 1248*b* configured to decode a vertical address signal ADD<vertical>, and transmit a decoded signal to the row decoder 1240*b*.

The stacked memory cell array 1250*b* may be disposed in memory cell layers Layer<0>~Layer<N> and be controlled by the row decoder 1240*b* and the column selection circuit 1247*b*. The row decoder 1240*b* may decode a row address signal ADD<ROW>, and generate a word line driving signal WL0 to drive corresponding word lines of the stacked memory cell array 1250*b*. The column decoder 1245*b* may decode a column address signal ADD<COL>, and generate a column selection signal BL0. The column selection circuit 1247*b* may generate column selection signals BL0(0) to BL0(N) based on a column selection signal, and control I/O operations of data to/from a selected memory cell array.

In an example shown in FIG. 13, a layer decoding operation for selecting a memory cell layer may be performed by the column decoder 1245*b* or the column selection circuit 1247*b*.

Figure 14:
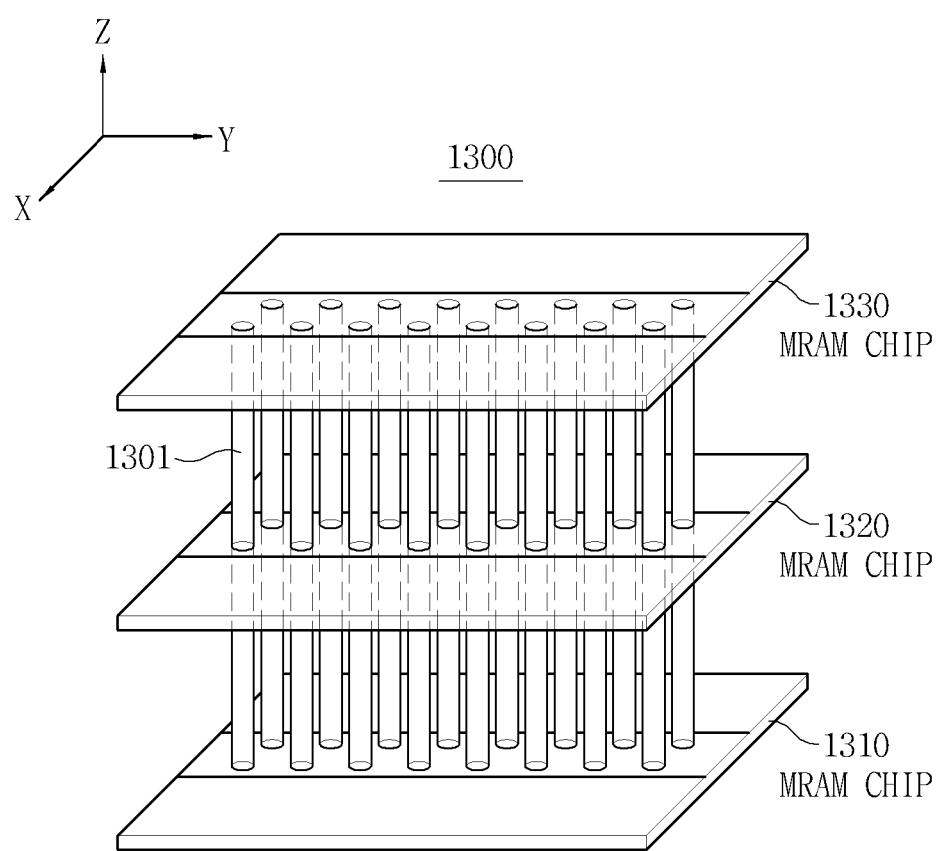

FIG. 14 is a perspective view of a 3-dimensional structure of the stacked MRAM device shown in FIG. 1 according to another embodiment.

Referring to FIG. 14, a stacked MRAM device 1300 may include memory chips 1310, 1320, and 1330 connected by through substrate vias (TSVs) 1301, such as through silicon vias. Although FIG. 14 illustrates TSVs 1301 arranged in two rows, the stacked MRAM device 1300 may include TSVs provided in an arbitrary number. Each of the memory chips 1310, 1320, and 1330 may include a memory cell array and a control circuit to perform program and read operations to and from the memory cell array. The memory chips 1310, 1320, and 1330 may be included in a stacked semiconductor package (e.g., on a package substrate). The stacked chips can be part of a memory device such as a memory card.

In the stacked MRAM device 1300 shown in FIG. 14, the memory chips 1310, 1320, and 1330 may have different characteristics. For instance, the memory chip 1310 may have a characteristic of medium endurance and medium retention, the memory chip 1320 may have a characteristic of higher endurance than the memory chip 1310, and the memory chip 1330 may have a characteristic of higher retention than the memory chip 1310. For example, normal cells may be disposed in the memory chip 1310, ECC cells or reference cells may be disposed in the memory chip 1320, and OTP cells may be disposed in the memory chip 1330.

Figure 15:
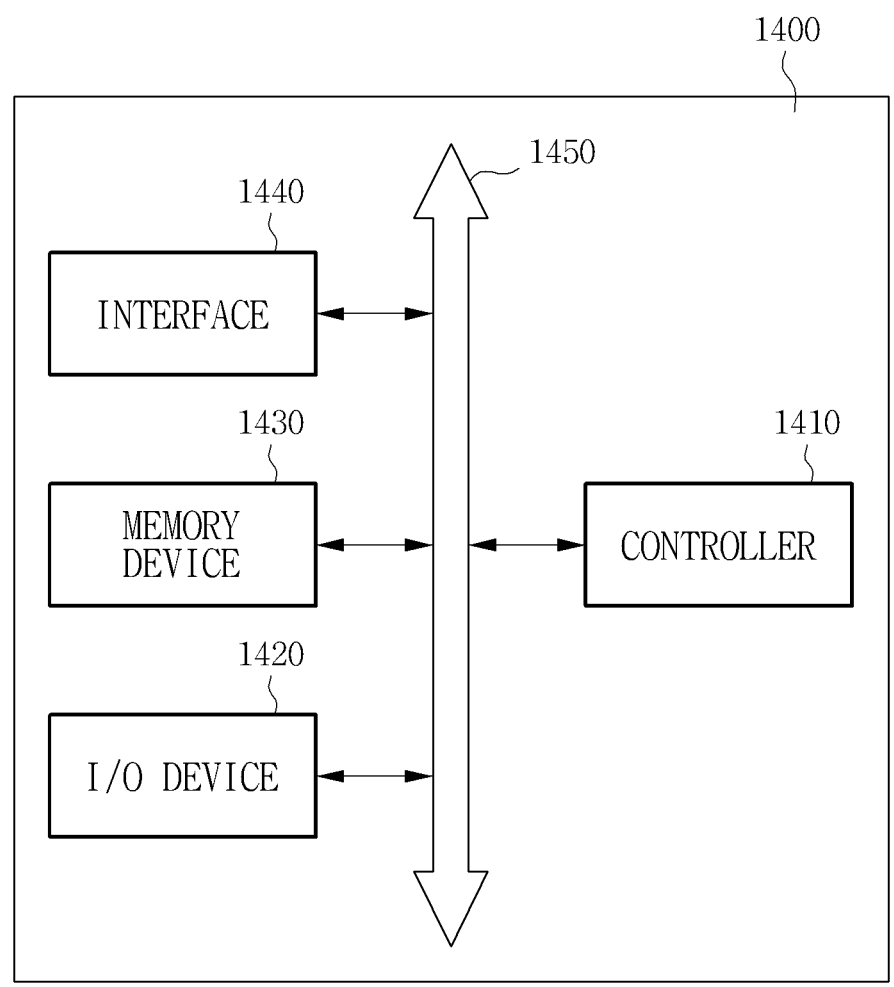

FIG. 15 is a block diagram of an electronic system including a stacked MRAM device according to example embodiments.

Referring to FIG. 15, an electronic system 1400 may include a controller 1410, an I/O device 1420, a memory device 1430, an interface 1440, and a bus 1450. The memory device 1430 may be a stacked MRAM device according to the various example embodiments. The bus 1450 may provide a path through which data may be communicated among the controller 1410, the I/O device 1420, the memory device 1430, and the interface 1440.

The controller 1410 may include at least one of at least one microprocessor (MP), at least one digital signal processor (DSP), at least one microcontroller (MC), and logic devices capable of similar functions thereto. The I/O device 1420 may include at least one selected out of a keypad, a keyboard, and a display device. The memory device 1430 may function to store data and/or commands executed by the controller 1410.

The interface 1440 may function to transmit/receive data to/from a communication network. The interface 1440 may be a wired/wireless type. For example, the interface 1440 may include an antenna or a wired/wireless transceiver. The electronic system 1400 may further include an application chipset, a camera image processor (CIP), and an I/O device.

The electronic system 1400 may be embodied by a mobile system, a personal computer (PC), an industrial computer, or a logic system having various functions. For instance, the mobile system may be any one of a personal digital assistant (PDA), a portable computer, a web tablet, a mobile phone, a wireless phone, a laptop computer, a memory card, a digital music system, and an information transmission/receiving system. When the electronic system 1400 is an apparatus capable of wireless communication, the electronic system 1100 may be used for a communication system, such as a code division multiple access (CDMA) system, a global system for mobile (GSM) communication, a North American digital cellular (NADC) system, an enhanced-time division multiple access (E-TDMA) system, a wideband code division multiple access (WCDMA) system, or CDMA2000.

As explained thus far, a stacked MRAM device according to embodiments of the present disclosure may include a semiconductor substrate and at least one additional memory cell layer. The semiconductor substrate may include a first memory cell array. Each of the memory cell layers may include a memory cell array having a different function from the first memory cell array and be stacked on the first memory cell array of the semiconductor substrate. Accordingly, the stacked MRAM device may provide memory cell arrays having various characteristics, which are included in memory cell layers, and have high density, high performance, and high reliability.

The present disclosure may be applied to a memory device and, more particularly, to a stacked MRAM device and a memory system including the same.

A stacked MRAM device according to embodiments may have high density, high performance, and high reliability because memory cell arrays having various characteristics or functions are included in memory cell layers.

The foregoing is illustrative of embodiments and is not to be construed as limiting thereof. Although a few embodiments have been described, those skilled in the art will readily appreciate that many modifications are possible without materially departing from the novel teachings and advantages of the present disclosure. Accordingly, all such modifications are intended to be included within the scope of this present disclosure as defined in the claims. In the claims, means-plus-function clauses are intended to cover the structures described herein as performing the recited function, and not only structural equivalents but also equivalent structures.

What is claimed is:

1. A stacked magnetic random access memory (MRAM) device comprising:
    a semiconductor substrate including a first memory cell array including normal data cells configured to store data;
    a second memory cell array disposed on the first memory cell array, the second memory cell array including error-correction code (ECC) cells configured to store ECC data or reference cells configured to store reference resistances; and
    one or more additional memory cell arrays including at least a third memory cell array including one-time programming (OTP) cells to store data only one time, wherein the third memory cell array is stacked on the second memory cell array.

2. The device of claim 1, wherein
    a first memory cell of the first memory cell array includes a first magnetic element including a first pinned magnetic layer, a first free magnetic layer, and a first tunnel barrier layer, a first memory cell of the second memory cell array includes a second magnetic element including a second pinned magnetic layer, a second free magnetic layer, and a second tunnel barrier layer, and a first memory cell of the third memory cell array includes a third magnetic element including a third pinned magnetic layer, a third free magnetic layer, and a third tunnel barrier layer,
    wherein a second thickness of the second free magnetic layer is greater than a first thickness of the first free magnetic layer, and
    wherein a third thickness of the third free magnetic layer is smaller than the first thickness.

3. The device of claim 1, wherein
    a first memory cell of the first memory cell array includes a first magnetic element including a first pinned magnetic layer, a first free magnetic layer, and a first tunnel barrier layer, a first memory cell of the second memory cell array includes a second magnetic element including a second pinned magnetic layer, a second free magnetic layer, and a second tunnel barrier layer, and a first memory cell of the third memory cell array includes a third magnetic element including a third pinned magnetic layer, a third free magnetic layer, and a third tunnel barrier layer,
    wherein a second thickness of the second free magnetic layer is smaller than a first thickness of the first free magnetic layer, and
    wherein a third thickness of the third free magnetic layer is greater than the first thickness.

4. The device of claim 1, wherein the semiconductor substrate includes a control circuit configured to drive at least the first, the second and the third memory cell arrays.

5. The device of claim 4, wherein the one or more additional memory cell arrays include n memory cell arrays, n is a natural number and greater than 2, further comprising a connection layer disposed on an uppermost memory cell array of the n memory cell arrays, wherein the connection layer electrically connects the each of n memory cell arrays to the control circuit.

6. A magnetic random access memory (MRAM) device comprising:
    a substrate including a control circuit;
    a first memory cell array disposed on the substrate, the first memory cell array including a plurality of memory cells, wherein each of the plurality of memory cells of the first memory cell array includes a first magnetic element and a first access element electrically connected to the first magnetic element, and wherein the first magnetic element includes a first pinned magnetic layer, a first free magnetic layer having a first thickness, and a first tunnel barrier layer between the first pinned magnetic layer and the first free magnetic layer; and
    a second memory cell array stacked on the first memory cell array, the second memory cell array including a plurality of memory cells, wherein each of the plurality of memory cells of the second memory cell array includes a second magnetic element and a second access element electrically connected to the second magnetic element, and wherein the second magnetic element includes a second pinned magnetic layer, a second free magnetic layer having a second thickness different from the first thickness, and a second tunnel barrier layer between the second pinned magnetic layer and the second free magnetic layer,
    wherein the control circuit is configured to drive the first and second memory cell arrays.

7. The MRAM device of claim 6, further comprising:
    a third memory cell array stacked on the second memory cell array, the third memory cell array including a plurality of memory cells, wherein each of the plurality of memory cells of the third memory cell array includes a third magnetic element and a third access element electrically connected to the third magnetic element, and wherein the third magnetic element includes a third pinned magnetic layer, a third free magnetic layer having a third thickness different from the first and the second thicknesses, and a third tunnel barrier layer between the third pinned magnetic layer and the third free magnetic layer.

8. The MRAM device of claim 7, further comprising a connection layer stacked on the third memory cell array, wherein the connection layer electrically connects the second memory cell array to the control circuit, and electrically connects the third memory cell array to the control circuit.

9. The MRAM device of claim 7, wherein the second thickness of the second free magnetic layer is greater than the first thickness of the first free magnetic layer, and wherein the third thickness of the third free magnetic layer is smaller than the first thickness of the first free magnetic layer.

10. The MRAM device of claim 7, wherein the second thickness of the second free magnetic layer is smaller than the first thickness of the first free magnetic layer, and wherein the third thickness of the third free magnetic layer is greater than the first thickness of the first free magnetic layer.

11. The MRAM device of claim 7, wherein each of the first and second access elements is one of a switch, a planar transistor, a vertical transistor, or a diode.

12. The MRAM device of claim 7, wherein each of the plurality of memory cells of the first memory cell array includes a normal data cell in which normal data is programmed, and wherein each of the plurality of memory cells of the second memory cell array includes an error-correction code (ECC) cell in which ECC data is programmed, a reference cell in which reference resistance is stored, or a one-time programming (OTP) cell in which data is programmed only one time.

13. A magnetic random access memory (MRAM) device comprising:
    a substrate;
    a first magnetic element array disposed on the substrate, the first magnetic element array including a plurality of magnetic elements, wherein each of the plurality of magnetic elements of the first magnetic element array includes a first pinned magnetic layer, a first tunnel barrier layer, and a first free magnetic layer having a first thickness; and
    a second magnetic element array stacked on the first magnetic element array, the second magnetic element array including a plurality of magnetic elements, wherein each of the plurality of magnetic elements of the second magnetic element array includes a second pinned magnetic layer, a second tunnel barrier layer, and a second free magnetic layer having a second thickness different from the first thickness.

14. The MRAM device of claim 13, wherein each of the first and second pinned magnetic layers includes a predetermined pinned magnetization direction,
    wherein the first tunnel barrier layer comprises an insulating film between the first pinned magnetic layer and the first free magnetic layer,
    wherein the second tunnel barrier layer comprises an insulating film between the second pinned magnetic layer and the second free magnetic layer, and
    wherein each of the first and second free magnetic layers is configured so it is able to be magnetized in the direction of an externally applied magnetic field.

15. The MRAM device of claim 13, further comprising: a third magnetic element array stacked on the second magnetic element array, the third magnetic element array including a plurality of magnetic elements, wherein each of the plurality of magnetic elements of the third magnetic element array includes a third pinned magnetic layer, a third tunnel barrier layer, and a third free magnetic layer having a third thickness different from the first and second thicknesses.

16. The MRAM device of claim 13, wherein each of the plurality of magnetic elements of the first magnetic element array includes a normal data cell in which normal data is programmed, and wherein each of the plurality of magnetic elements of the second magnetic element array includes an error-correction code (ECC) cell in which ECC data is programmed, a reference cell in which reference resistance is stored, or a one-time programming (OTP) cell in which data is programmed only one time.

17. The MRAM device of claim 13, wherein the substrate includes a plurality of access elements electrically connected to the plurality of magnetic elements of the first magnetic element array, respectively, and includes a plurality of access elements electrically connected to the plurality of magnetic elements of the second magnetic element array, respectively, and wherein each of the plurality of access elements is one of a switch, a planar transistor, a vertical transistor, or a diode.

18. The MRAM device of claim 13, wherein the first magnetic element array further includes a plurality of access elements electrically connected to the plurality of magnetic elements of the first magnetic element array, respectively,
    wherein the second magnetic element array further includes a plurality of access elements electrically connected to the plurality of magnetic elements of the second magnetic element array, respectively, and
    wherein each of the plurality of access elements is one of a switch, a planar transistor, a vertical transistor, or a diode.

* * * * *